United States Patent
Chen et al.

(10) Patent No.: US 7,646,658 B2
(45) Date of Patent: Jan. 12, 2010

(54) MEMORY DEVICE WITH DELAY TRACKING FOR IMPROVED TIMING MARGIN

(75) Inventors: Zhiqin Chen, San Diego, CA (US); Chang Ho Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 105 days.

(21) Appl. No.: 11/756,029

(22) Filed: May 31, 2007

(65) Prior Publication Data
US 2008/0298143 A1     Dec. 4, 2008

(51) Int. Cl.
*G11C 7/02* (2006.01)
(52) U.S. Cl. ............... 365/210.1; 365/233.1; 365/194; 365/189.15; 365/189.16; 365/189.09
(58) Field of Classification Search ............ 365/233.1, 365/194, 210.1, 189.15, 189.16, 189.19, 365/189.09, 210.4, 233.19
See application file for complete search history.

(56) References Cited

U.S. PATENT DOCUMENTS

| 6,392,957 | B1 | 5/2002 | Shubat et al. | |
| 6,717,877 | B2 | 4/2004 | Suzuki et al. | |
| 7,376,032 | B2 * | 5/2008 | Nguyen et al. | 365/210.1 |
| 7,403,433 | B2 * | 7/2008 | Ahmad | 365/189.09 |
| 2006/0050572 | A1 * | 3/2006 | Gouin et al. | 365/194 |
| 2008/0112245 | A1 * | 5/2008 | Ostermayr et al. | 365/210.1 |

FOREIGN PATENT DOCUMENTS

EP        1630815        3/2006

OTHER PUBLICATIONS

International Search Report, PCT/US2008/065450—International Search Authority—European Patent Office—Nov. 6, 2008.
Written Opinion, PCT/US2008/065450—International Search Authority—European Patent Office—Nov. 6, 2008.

* cited by examiner

*Primary Examiner*—Hoai V Ho
*Assistant Examiner*—Fernando N Hidalgo
(74) *Attorney, Agent, or Firm*—Nicholas J. Pauley; Sam Talpalatsky; Peter Kamarchik

(57) ABSTRACT

A memory device that can provide good timing margins for read and write operations is described. In one design, the memory device includes a memory array, a timing control circuit, and an address decoder. The memory array includes memory cells for storing data and dummy cells to mimic the memory cells. The timing control circuit generates at least one control signal used for writing data to the memory cells and having timing determined based on the dummy cells. The timing control circuit may generate a pulse on an internal clock signal with a driver having configurable drive strength and a programmable delay unit. The pulse duration may be set to obtain the desired write timing margin. The address decoder activates word lines for rows of memory cells for a sufficiently long duration, based on the internal clock signal, to ensure reliable writing of data to the memory cells.

31 Claims, 8 Drawing Sheets

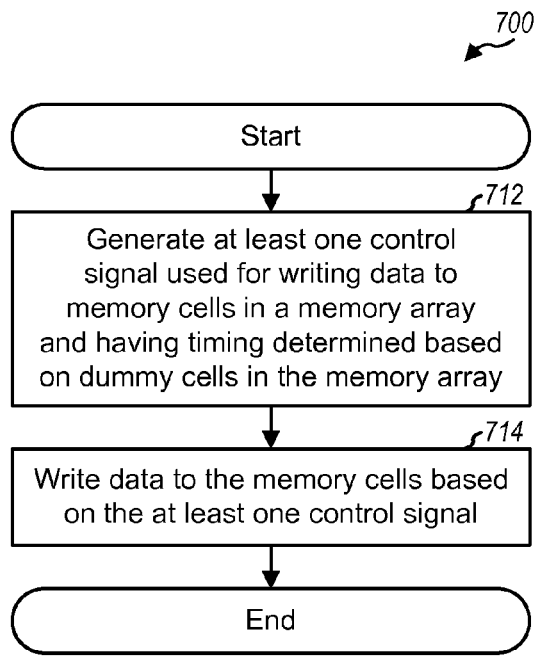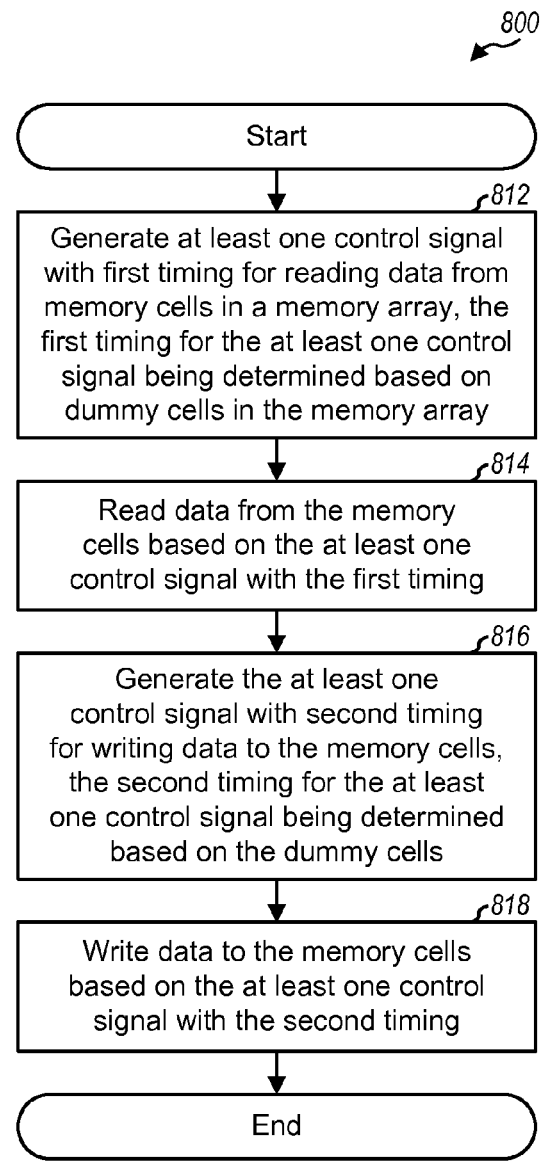
FIG. 7
FIG. 8

MEMORY DEVICE WITH DELAY TRACKING FOR IMPROVED TIMING MARGIN

BACKGROUND

I. Field

The present disclosure relates generally to electronics, and more specifically to a memory device.

II. Background

Memory devices are commonly used in many electronics devices such as computers, wireless communication devices, personal digital assistants (PDAs), etc. A memory device typically includes many rows and columns of memory cells. Each memory cell can store a data value, which is typically either binary '0' or '1'. To read a given memory cell in a given row and a given column, a word line for the row is activated, and the memory cell either charges or discharges a bit line for the column depending on the data value stored in the memory cell. A sense amplifier then detects the voltage on the bit line and provides a logic value based on the detected voltage. To write to a given memory cell in a given row and a given column, the word line for the row is activated. A data input driver then drives the bit line for the column either low or high depending on a data value to be written to the memory cell. The data value currently stored in the memory cell is overwritten by the value on the bit line.

For a read operation, the sense amplifier should be turned on as early as possible and for a minimum amount of time in order to achieve high operating speed and low power consumption. The sense amplifier may be activated after the bit line has been sufficiently charged or discharged, so that the data value stored in the memory cell can be reliably detected. This charge/discharge time is dependent on characteristics of transistors in the memory cells and parasitic effects, both of which may vary widely due to variations in integrated circuit (IC) process, power supply voltage, and temperature. For a write operation, the data input driver should be turned on for as long as needed to write a data value into the memory cell. The amount of time needed to write to the memory cell is dependent on the transistor characteristics and parasitic effects.

Process variations are typically more severe as IC fabrication technology improves and transistor size shrinks. The amount of time to allocate for a read operation may be selected based on the worst-case process variations in order to ensure that a bit line is sufficiently charged or discharged prior to sensing. The amount of time to allocate for a write operation may also be selected based on the worst-case process variations in order to ensure that a memory cell is properly written with an input data value. However, designing for the worst-case process variations may result in slower operating speed and/or higher power consumption.

There is therefore a need in the art for a memory device that can efficiently account for process, voltage, and temperature (PVT) variations.

SUMMARY

A memory device that can provide good timing margins for read and write operations across PVT variations is described herein. In one design, the memory device includes a memory array, a timing control circuit, and an address decoder. The memory array includes memory cells for storing data and dummy cells to mimic certain characteristics (e.g., loading) of the memory cells. The timing control circuit generates at least one control signal used for writing data to the memory cells and having timing determined based on the dummy cells. The timing control circuit may generate an internal clock signal based on the dummy cells, e.g., based on loading on a self-timed bit line for a column of dummy cells and/or loading on a dummy word line for a row of dummy cells. The address decoder may activate word lines for rows of memory cells for a sufficiently long duration, based on the internal clock signal, to ensure reliable writing of data to the memory cells.

The timing control circuit may include a driver having configurable drive strength and a programmable delay unit. The driver may drive the self-timed bit line with a drive strength that may be varied by enabling all or some of a set of selectable transistors. The timing control circuit may generate a pulse on the internal clock signal for a write operation. The pulse duration may be determined based on the loading on the self-timed bit line and/or the dummy word line, the drive strength of the driver, and the delay provided by the programmable delay unit. The pulse duration may be set to obtain the desired write timing margin.

The timing control circuit may generate the at least one control signal with first timing for read operations and with second timing for write operations. The first timing may be set based on read timing margin for read operations, and the second timing may be set based on write timing margin for write operations. The first and second timing may be quantified by different pulse widths on control signals, different time differences between transition edges on control signals, etc. For example, the timing control circuit may generate the internal clock signal with a first pulse width for read operations and with a second pulse width for write operations. The second pulse width may be longer than the first pulse width in order to provide more time to write data to the memory cells. The word lines may be activated for a first duration for read operations and for a second duration for write operations. The first and second active durations for the word lines may be determined by the first and second pulse widths, respectively, for the internal clock signal.

Various aspects and features of the disclosure are described in further detail below.

BRIEF DESCRIPTION OF THE DRAWINGS

FIG. 7 shows a process for writing data to memory cells in a memory array.

FIG. 8 shows a process for reading data from and writing data to memory cells in a memory array.

DETAILED DESCRIPTION

A memory device with delay tracking and having good read and write timing margins is described herein. The memory device may be a random access memory (RAM), a static RAM (SRAM), a dynamic RAM (DRAM), a synchronous DRAM (SDRAM), a video RAM (VRAM), a synchronous graphic RAM (SGRAM), a read only memory (ROM), a Flash memory, etc. The memory device may be a stand-alone device or may be embedded within another device, e.g., a processor.

Figure 1:
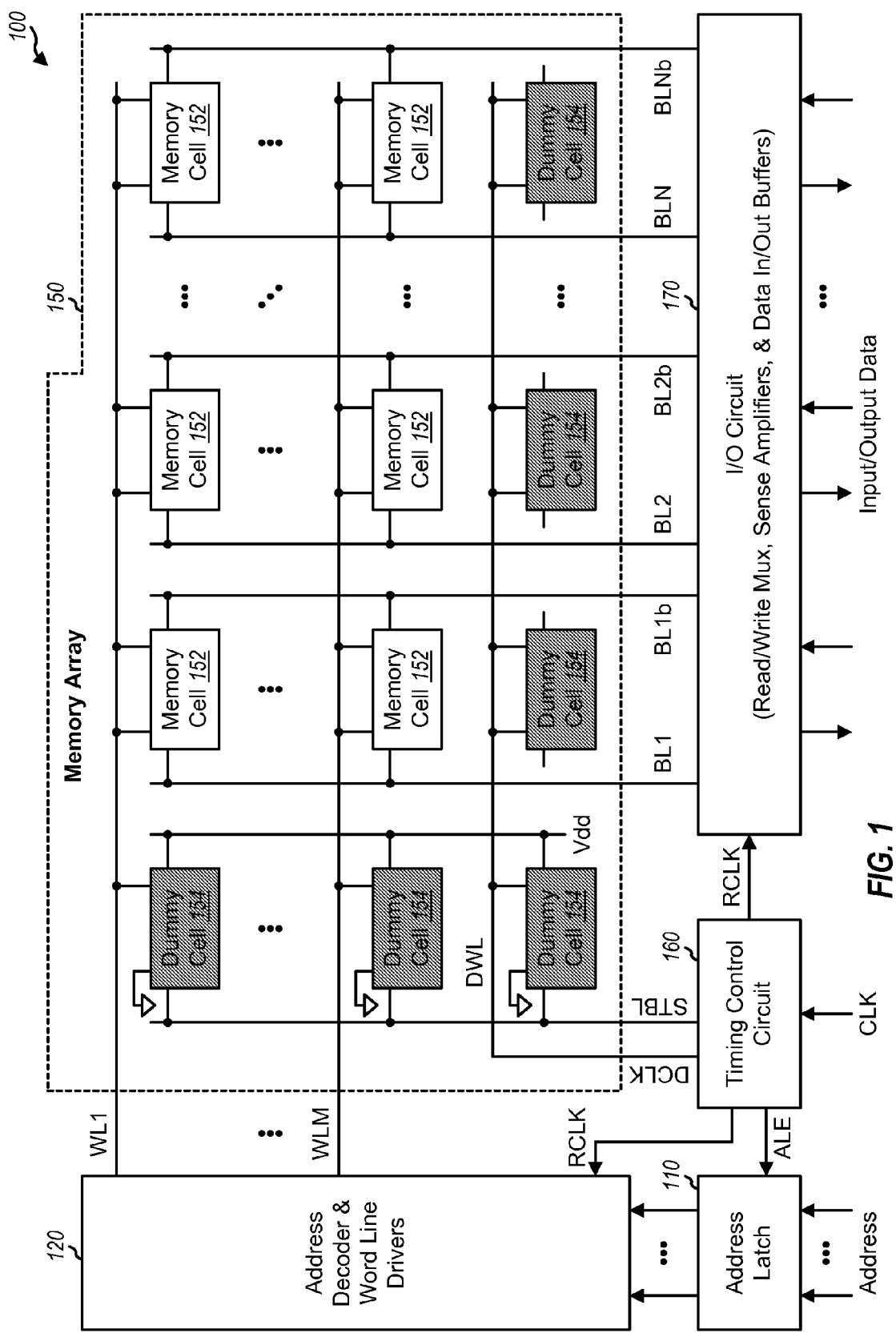
FIG. 1 shows a block diagram of a memory device with delay tracking.

FIG. 1 shows a block diagram of a design of a memory device 100 with delay tracking. Memory device 100 includes an address latch 110, an address decoder and word line drivers 120, a memory array 150, a timing control unit 160, and an I/O circuit 170.

Memory array 150 includes M rows and N columns of memory cells 152 and further includes one row and one column of dummy cells 154. In general, M and N may each be any value. A memory cell is a circuit that can store a data value and may be implemented with various circuit designs. A dummy cell is a circuit that can store a known value and/or is connected in a particular manner to achieve a desired loading effect. A dummy cell may be implemented with the same or similar circuit design as a memory cell. The M rows of memory cells are selected via M word lines WL1 through WLM. The row of dummy cells is coupled to a dummy word line DWL. The N columns of memory cells are coupled to N differential bit lines BL1 and BL1b through BLN and BLNb. The column of dummy cells is coupled to a self-time bit line STBL.

Address latch 110 receives an address for a memory cell or a block of memory cells to be accessed and latches the address based on an address latch enable (ALE) signal. Address decoder 120 receives the latched address and may generate a row address based on the received address. Address decoder 120 may then perform pre-decoding on the row address and provide pre-decoded signals that indicate a specific word line to activate or assert. Word line drivers 120 receive the pre-decoded signals and drive a specific word line, as indicated by the pre-decoded signals, so that the desired row of memory cells can be accessed.

Timing control circuit 160 receives a clock signal CLK and is also coupled to the self-timed bit line STBL and the dummy word line DWL. Timing control circuit 160 generates control signals used to control the operation of memory device 100, e.g., control signals used for read and write operations. The control signals have timing determined by the column and row of dummy cells, as described below. I/O circuit 170 includes various circuits for reading data from the memory cells and writing data to the memory cells. For example, I/O circuit 170 includes a sense amplifier and a data output buffer for each differential bit line for reading data from the memory cells coupled to that bit line. I/O circuit 170 further includes a data latch and data input buffers for each differential bit line for writing data to the memory cells coupled to that bit line. Some of the circuit blocks in FIG. 1 are described in further detail below.

Figure 2:
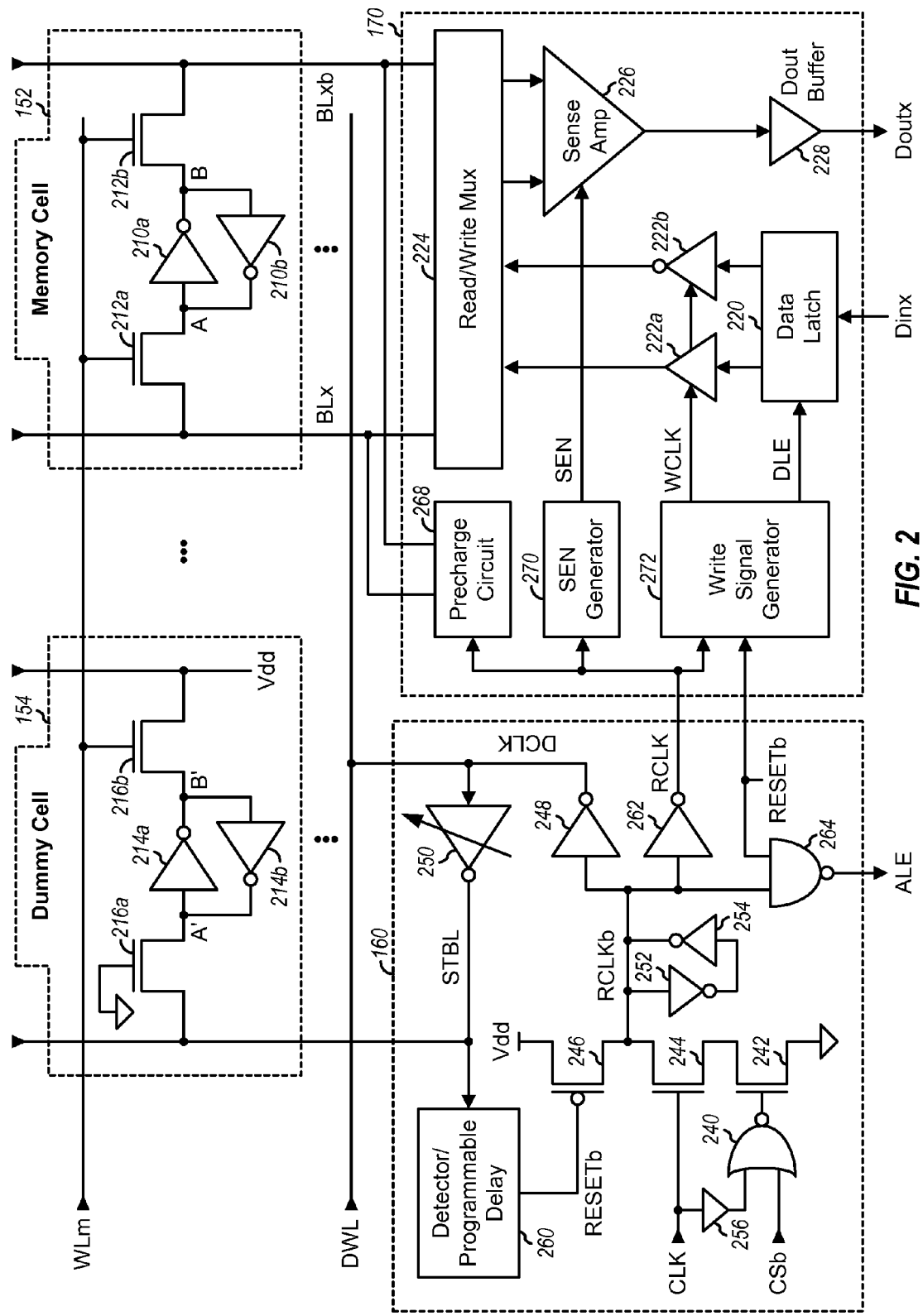
FIG. 2 shows a memory array, a timing control circuit, and an input/output (I/O) circuit within the memory device in FIG. 1.

FIG. 2 shows a schematic diagram of a design of memory array 150, timing control circuit 160, and I/O circuit 170 in FIG. 1. For clarity, only one memory cell 152 and one dummy cell 154 in memory array 150 is shown in FIG. 2. Furthermore, only the dummy word line DWL is shown in FIG. 2 but not the dummy cells coupled to this word line. Also for clarity, read/write circuitry for only one bit line is shown in FIG. 2.

In the design shown in FIG. 2, memory cell 152 includes a pair of cross-coupled inverters 210a and 210b and a pair of pass transistors 212a and 212b. Each inverter 210 may be formed with a P-channel field effect transistor (P-FET) and an N-channel field effect transistor (N-FET), as is known in the art. Inverter 210a has its input coupled to a node A and its output coupled to a node B. Inverter 210b has its input coupled to node B and its output coupled to node A. Each pass transistor 212 is implemented with an N-FET. N-FET 212a has its drain coupled to node A, its gate coupled to a word line WLm, and its source coupled to a bit line BLx, where m∈{1, . . . , M} and x∈{1, . . . , N}. N-FET 212b has its drain coupled to node B, its gate coupled to word line WLm, and its source coupled to a complementary bit line BLxb.

Inverters 210a and 210b store a data value via positive feedback. If memory cell 152 stores logic high ('1'), node A is at logic high and node B is at logic low. If memory cell 152 stores logic low ('0'), node A is at logic low and node B is at logic high. For a memory read, lines BLx and BLxb are initially pre-charged to logic high, then word line WLm is asserted to logic high, and N-FETs 212a and 212b are turned on. If memory cell 152 stores logic high, then bit line BLx is charged by inverter 210b via N-FET 212a, and complementary bit line BLxb is discharged by inverter 210a via N-FET 212b. The converse is true if memory cell 152 stores logic low. A sense amplifier 226 detects the voltage difference between lines BLx and BLxb to determine the data value stored in memory cell 152.

For a memory write, lines BLx and BLxb are initially pre-charged to logic high, then word line WLm is asserted to logic high, and N-FETs 212a and 212b are turned on. To write logic high ('1') to memory cell 152, bit line BLx is driven high and forces node A to logic high via N-FET 212a, and complementary bit line BLxb is driven low and forces node B to logic low via N-FET 212b. If memory cell 152 currently stores logic low, then nodes A and B would need to be "flipped" by lines BLx and BLxb in order to store logic high. The amount of time needed to flip nodes A and B is dependent on the strength of inverters 210a and 210b, which are designed to maintain the current logic value and thus fight against drivers 222a and 222b driving lines BLx and BLxb. If inverters 210a and 210b are strong, then a longer time period may be needed to flip nodes A and B. The strength of inverters 210a and 210b may vary widely due to PVT. The converse of the above is true when writing logic low to memory cell 152.

In the design shown in FIG. 2, dummy cell 154 includes inverters 214a and 214b and N-FETs 216a and 216b that are coupled as described above for inverters 210a and 210b and N-FETs 212a and 212b in memory cell 152, albeit with the following differences. N-FET 216a has its gate coupled to circuit ground and its source coupled to the self-timed bit line STBL. N-FET 216b has its drain coupled to a power supply voltage, Vdd. In this design, N-FET 216a is always turned off, node A' is at logic low, and node B' is at logic high.

Dummy cells 154 in memory array 150 may be implemented with the same structure and size as regular memory cells 152. The self-timed bit line STBL for the column of dummy cells 154 may then have the same loading as each of the N bit lines BL1 to BLN. The dummy word line DWL for the row of dummy cells 154 may also have the same loading as each of the M word lines WL1 to WLM. Control signals used for read and write operations may be generated with the self-timed bit line STBL and the dummy word line DWL and may then track the timing of memory cells 152.

In the design shown in FIG. 2, for each bit line, I/O circuit 170 includes a data latch 220, data input drivers 222a and 222b, a read/write multiplexer (Mux) 224, sense amplifier 226, and an output data (Dout) buffer 228. Multiplexer 224 couples lines BLx and BLxb to drivers 222a and 222b for write operations and to sense amplifier 226 for read operations. For a write operation, latch 220 receives and latches an input data value Dinx based on a data latch enable (DLE) signal. Data input drivers 222a and 222b receive the latched data value and drive lines BLx and BLxb, respectively, when enabled by a write clock (WCLK) signal. For a read operation, sense amplifier 226 amplifies the voltage difference between lines BLx and BLxb, detects a logic value (e.g., either logic low or high) for the amplified voltage when enabled by a sense amplifier enable (SEN) signal, and provides the detected logic value. Buffer 228 buffers the output of sense amplifier 226 and provides an output data value, Doutx.

Timing control circuit 160 uses dummy cells 154 to generate the control signals for read and write operations. In the design shown in FIG. 2, timing control circuit 160 generates a window/pulse on an internal clock (DCLK) signal for each read and write operation. The width of the window on the DCLK signal is determined by dummy cells 154 and may also be adjusted via programmable means to achieve good timing margins for both read and write operations. Various control signals are generated based on the DCLK signal, as described below.

In the design shown in FIG. 2, within timing control circuit 160, a NOR gate 240 receives the CLK signal via a delay circuit 256 and a complementary chip select (CSb) signal at two inputs. The CSb signal is at logic low when memory device 100 is enabled and is at logic high otherwise. Delay circuit 256 may be implemented with two or more inverters coupled in series. N-FETs 242 and 244 and a P-FET 246 are coupled in a stacked configuration. N-FET 242 has its source coupled to circuit ground, its gate coupled to the output of NOR gate 240, and its drain coupled to the source of N-FET 244. N-FET 244 has its gate receiving the CLK signal and its drain coupled to the drain of P-FET 246 and providing an RCLKb signal. P-FET 246 has its gate receiving a RESETb signal and its source coupled to the power supply. Inverters 252 and 254 are coupled in series, with the input of inverted 252 receiving the RCLKb signal, the input of inverted 254 coupled to the output of inverter 252, and the output of inverter 254 coupled to the input of inverter 252.

An inverter 248 receives the RCLKb signal and provides the DCLK signal. The DCLK signal drives the dummy word line DWL and thus observes loading similar to that on a normal word line. An inverter 262 also receives the RCLKb signal and provides an RCLK signal. The DCLK and RCLK signals have the same logic value but slightly different timing due to the different loading observed by these two signals. The DCLK and RCLK signals may be considered as different versions of the internal clock signal.

An inverting driver 250 receives the DCLK signal from inverter 248 and drives the self-timed bit line STBL. Driver 250 has configurable drive strength that may be set to generate a desired window width on the DCLK signal. A circuit 260 detects a STBL signal on the self-timed bit line and generates the RESETb signal. Circuit 260 may also provide a programmable delay for the RESETb signal, which may be used to obtain a longer window on the DCLK signal.

A NAND gate 264 receives the RCLKb signal and the RESETb signal and generates the ALE signal. A pre-charge circuit 268 receives the RCLK signal and generates signals that pre-charge lines BLx and BLxb to known values (e.g., logic high on both lines BLx and BLxb) prior to each read and write operation. Pre-charge circuit 268 may directly drive lines BLx and BLxb, as shown in FIG. 2. A SEN generator 270 receives the RCLK signal and generates the SEN signal for sense amplifier 226. A write signal generator 272 receives the RCLK and RESETb signals and generates the WCLK signal for data input drivers 222a and 222b and the DLE signal for data latch 220.

Figure 3A:
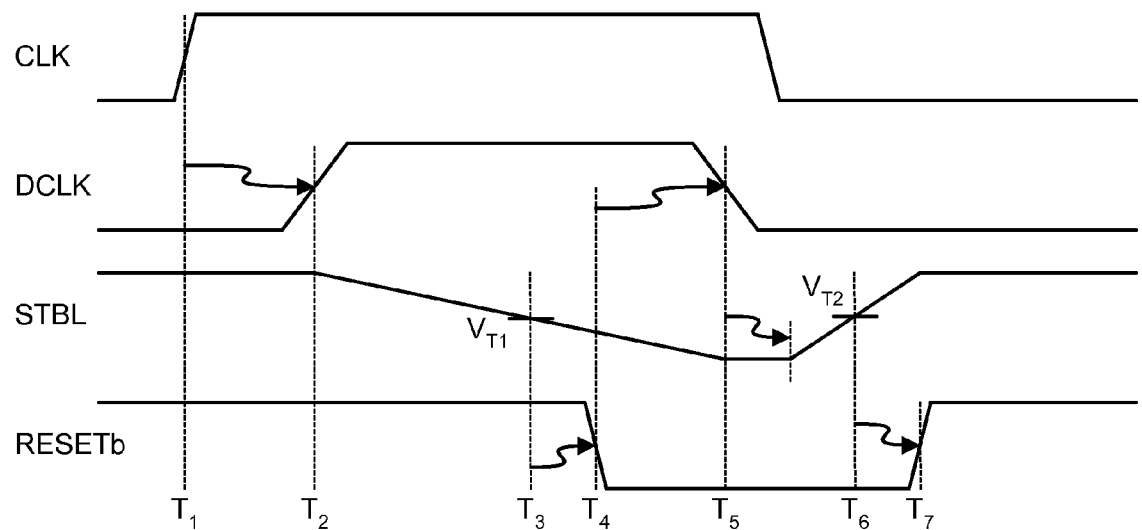
FIG. 3A shows a timing diagram for DCLK and RESETb signals.

FIG. 3A shows a timing diagram that illustrates the generation of the DCLK and RESETb signals in FIG. 2. The CSb signal is at logic low to enable memory device 100, and the RESETb signal is initially at logic high. Prior to time $T_1$, the CLK signal is at logic low, N-FET 242 is turned on, and N-FET 244 is turned off. The CLK signal transitions from logic low to logic high at time $T_1$. N-FET 242 is then turned on and pulls the RCLKb signal to logic low, which then causes the DCLK signal to transition to logic high at time $T_2$. The rising edge on the CLK signal thus generates a rising edge on the DCLK signal. N-FET 242 is turned off a brief delay after time $T_1$ by the logic high on the CLK signal, and inverters 252 and 254 act as a keeper that maintains the logic low for the RCLKb signal.

The self-timed bit line STBL is initially pre-charged to logic high prior to a read or write operation. The rising edge on the DCLK signal, which rises slower than other control signals because of the loading due to the dummy word line DWL, activates the self-time delay tracking mechanism implemented with dummy cells 154. Inverting driver 250 drives the self-timed bit line STBL toward logic low upon receiving the rising edge on the DCLK signal. The speed/rate at which the self-timed bit line STBL is pulled down is determined by the loading on this bit line as well as the drive strength of driver 250, which may be varied as described below to achieve the desired read and write timing margins. The self-timed bit line has loading due to the column of dummy cells 154 and mimics the loading on regular bit line BLx due to a column of memory cells 152. Circuit 260 detects when the self-timed bit line crosses below a first threshold voltage $V_{T1}$ at time $T_3$ and generates a falling edge on the RESETb signal at time $T_4$. Circuit 260 may further delay the falling edge on the RESETb signal by a programmable amount, as described below. P-FET 246 is turned on by the logic low on the RESETb signal and pulls the RCLKb signal to logic high, which then causes the DCLK signal to transition to logic low at time $T_5$. The falling edge on the RESETb signal thus generates a falling edge on the DCLK signal.

Inverting driver 250 drives the self-timed bit line STBL toward logic high upon receiving the falling edge on the DCLK signal. Inverting driver 250 pulls down the self-timed bit line at a slow rate using relatively weak pull-down transistors that mimic the worst-case transistors in memory cells 152. Inverting driver 250 pulls up the self-timed bit line at a faster rate with relatively strong pull-up transistors. Circuit 260 detects when the self-timed bit line crosses above a second threshold voltage $V_{T2}$ at time $T_6$ and generates a rising edge on the RESETb signal at time $T_7$.

In the design shown in FIG. 2, the pulse width on the DCLK signal is dependent on the drive strength of inverting driver 250, which may be varied by enabling all or a subset of the available pull-down transistors in inverting driver 250. These pull-down transistors capture PVT variations of the transistors in the memory cells. In general, the pulse width on the DCLK signal may be varied by controlling the drive strength of inverting driver 250 and/or selecting an appropriate amount of delay in circuit 260 to achieve good timing margins for both read and write operations.

Figure 3B:
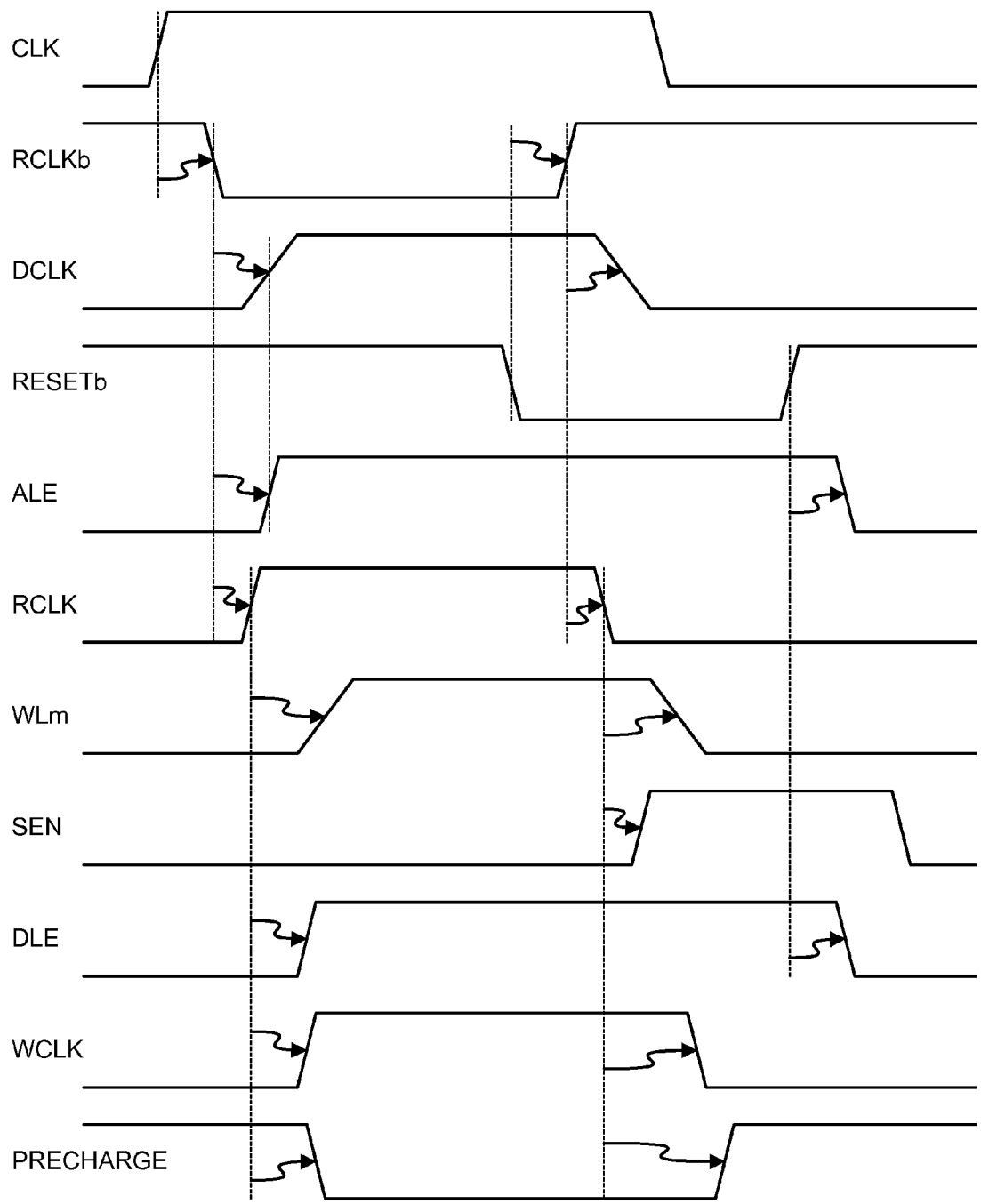
FIG. 3B shows generation of control signals for read and write operations.

FIG. 3B shows generation of various control signals used for read and write operations. NAND gate 268 generates the ALE signal based on the RCLKb and RESETb signals. The ALE signal has a pulse width determined by the low pulse on the RCLKb signal and the low pulse on the RESETb signal. The ALE signal is used by address latch 110 in FIG. 1 to latch an address.

The RCLK signal may be used to assert word line WLm for a selected row of memory cells. The active duration of word line WLm may be determined by (e.g., set equal to) the window on the RCLK signal. For example, word line WLm may be asserted by the rising edge on the RCLK signal and de-asserted by the falling edge on the RCLK signal. Word line WLm turns on N-FETs 212a and 212b in memory cell 152, as shown in FIG. 2. For a read operation, the active duration of word line WLm determines the amount of time that memory cell 152 can discharge lines BLx and BLxb. For a write operation, the active duration of word line WLm determines the amount of time allowed to write data to memory cell 152. Word line WLm may be asserted for different durations for read and write operations, as described below.

For a read operation, SEN generator 270 may generate a pulse on the SEN signal based on a falling edge on the RCLK signal. This pulse may be used to enable sense amplifier 226 to detect the voltage difference between lines BLx and BLxb. For a write operation, generator 272 may generate the DLE signal based on the RCLK and RESETb signals. The DLE signal is used by data latch 220 in FIG. 2 to latch the input data and may have similar timing as the ALE signal. Generator 272 may also generate the WCLK signal, which is used to enable data input drivers 222a and 222b, based on the RCLK signal.

Circuit 228 generates a PRECHARGE signal that precharges lines BLx and BLxb to logic high prior to each read and write operation. The PRECHARGE signal is disabled while lines BLx and BLxb are driven by either the selected memory cell during a memory read or data input buffers 222a and 222b during a memory write. The PRECHARGE signal may be generated based on the RCLK signal and may have rising and falling edges determined by those on the RCLK signal.

Figure 4:
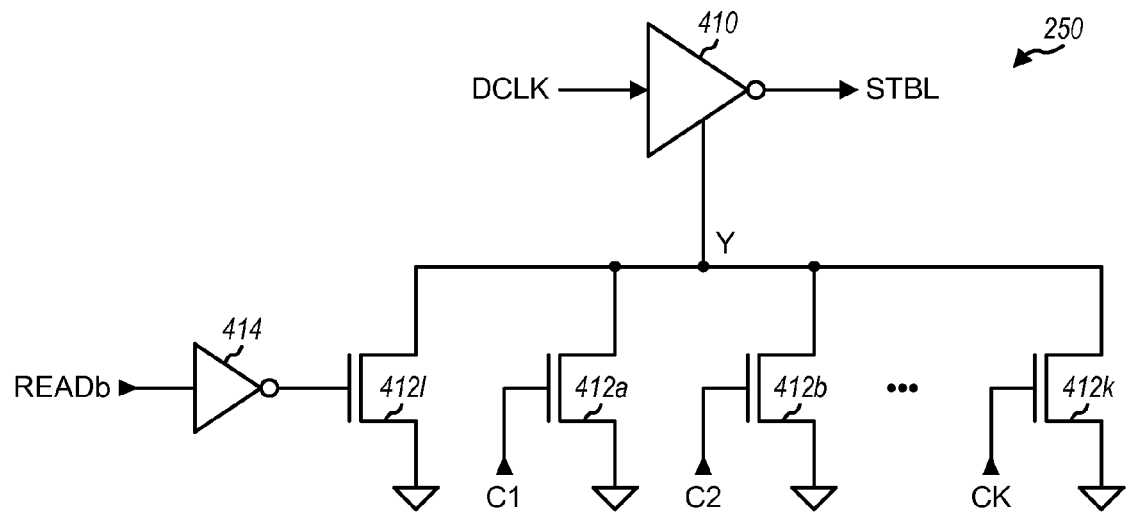
FIG. 4 shows a driver with configurable drive strength.

FIG. 4 shows a schematic diagram of a design of inverting driver 250 in FIG. 2. Within inverting driver 250, an inverter 410 receives the DCLK signal and drives the self-timed bit line STBL. The pull-down for inverter 410 is provided by N-FETs 412a through 412l. Each N-FET 412 has its drain coupled to a pull-down node Y for inverter 410 and its source coupled to circuit ground. An inverter 414 receives a complementary read (READb) signal and drives the gate of N-FET 412l. The gates of N-FETs 412a through 412k receive K accelerator control signals C1 through CK, respectively, where K may be any integer value, e.g., K=16.

Each N-FET 412 may be turned on to provide more pull-down for inverter 410, which would then increase the drive strength of inverter 410 and consequently shorten the window on the DCLK signal. N-FET 412l is turned on for each read operation. A sufficient number of N-FETs among N-FETs 412a through 412k may also be turned on for each read operation to obtain the desired read timing margin. An accelerator setting indicates which of N-FETs 412a through 412k to turn on for each read operation. The accelerator setting may be determined during a design phase and/or a test phase for memory device 100. The N-FETs 412 that are enabled may mimic the worst-case transistors in memory cells 152. For example, the amount of time needed by the worst-case transistors to generate a particular voltage difference (e.g., 200 mV) on lines BLx and BLxb may be determined and denoted as the minimum discharge time. A set of N-FETs 412 may then be selected such that the pulse width on the DCLK signal is equal to or greater than the minimum discharge time.

In one design, a single accelerator setting is used for both read and write operations and is selected to achieve the desired read timing margin, the desired write timing margin, or both. The amount of time to write a data value to a memory cell may be longer than the amount of time to read a data value from a memory cell. The longer write duration may be due to the reason described above for memory cell 152 in FIG. 2. N-FET 412l may be turned off for each write operation, which would then result in less drive strength for inverter 410. This would then result in the window on the DCLK signal having a wider width for a write operation than a read operation, for the same accelerator setting. N-FET 412l may be designed to provide a suitable amount of extra time (e.g., 200 pico seconds) for a write operation to achieve the desired write timing margin. N-FET 412l may also be disabled for write operations if a longer DCLK pulse width is not needed.

In another design, one accelerator setting is used for read operations and is selected to achieve the desired read timing margin. Another accelerator setting is used for write operations and is selected to achieve the desired write timing margin. An appropriate accelerator setting may be applied to N-FETs 412 depending on whether a read or write operation is performed.

Figure 5:
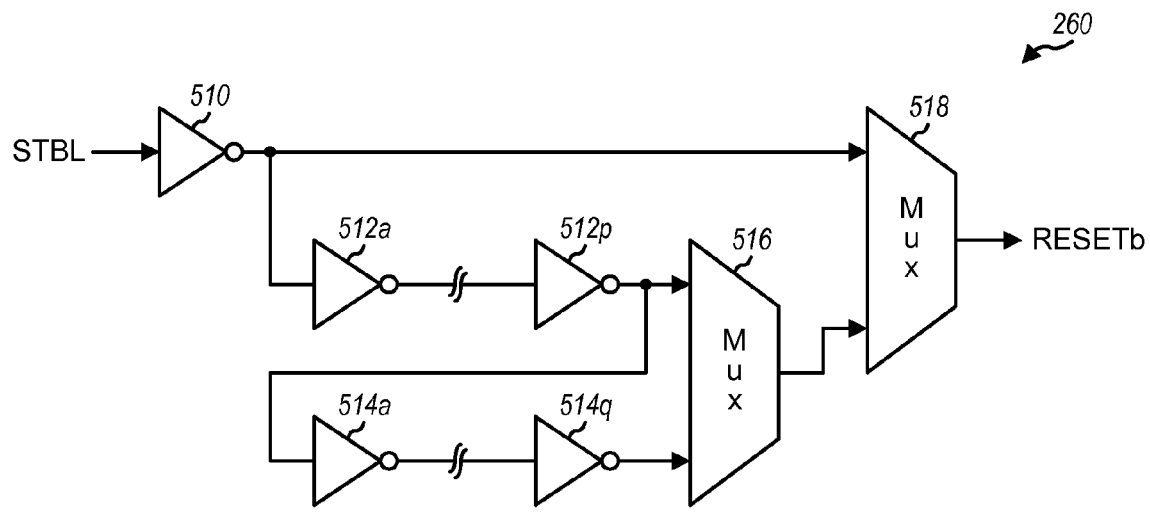
FIG. 5 shows a circuit with programmable delay.

FIG. 5 shows a schematic diagram of a design of circuit 260 in FIG. 2. In this design, circuit 260 includes an inverter 510 that receives the analog STBL signal on the self-timed bit line and provides a corresponding digital signal to a multiplexer 518. Inverter 510 detects when the STBL signal crosses below the $V_{T1}$ threshold and provides a falling edge at its output. Inverter 510 also detects when the STBL signal exceeds the $V_{T2}$ threshold and provides a rising edge at its output.

The output of inverter 510 is also provided to a programmable delay unit formed with inverters 512a through 512p and inverters 514a through 514q, which are coupled in series. Inverter 512a receives the output of buffer 510, and inverters 512p and 514q provide their outputs to a multiplexer 516. Multiplexer 516 provides the output of either inverter 512p or 514q to multiplexer 518. Multiplexer 518 provides the output of either inverter 510 or multiplexer 516 as the RESETb signal.

In the design shown in FIG. 5, three different delays may be selected for the RESETb signal. The shortest delay is obtained by providing the output of inverter 510 via multiplexer 518 as the RESETb signal. A medium delay is obtained by providing the output of inverter 510 via inverters 512a through 512p and multiplexers 516 and 518 as the RESETb signal. The longest delay is obtained by providing the output of inverter 510 via inverters 512a through 512p, inverters 514a through 514q, and multiplexers 516 and 518 as the RESETb signal. The programmable delay may be used to extend the window on the DCLK signal when selecting the minimum number of N-FETs 412 in inverting driver 250 does not provide a sufficiently long window on the DCLK signal.

Figure 6:
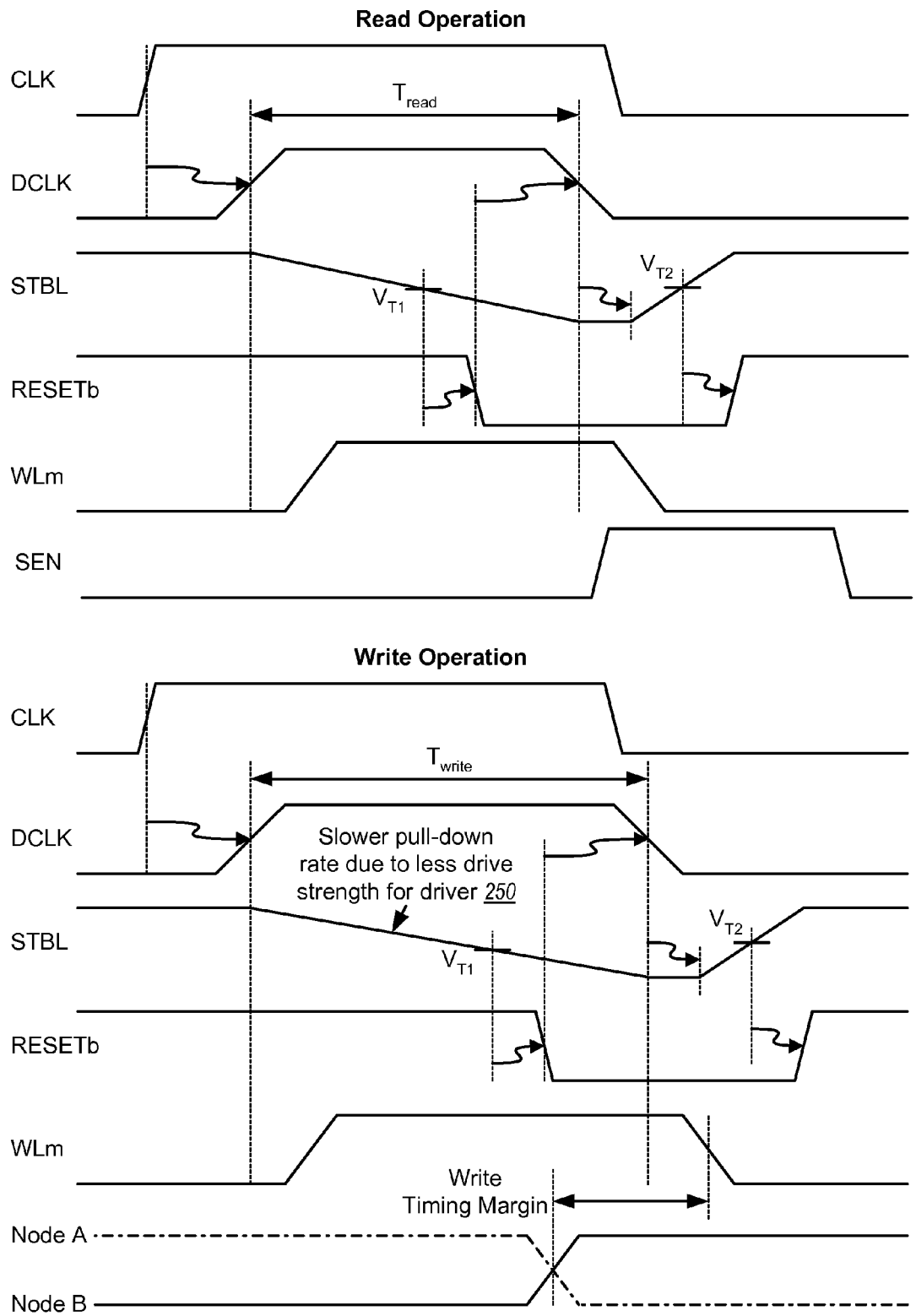
FIG. 6 shows control signals for read and write operations.

FIG. 6 illustrates generation of the control signals for read and write operations. The CLK, DCLK, STBL, RESETb, and WLm signals may be generated as described above for FIGS. 3A and 3B. For a read operation, the drive strength of inverting driver 250 is determined by the accelerator setting and N-FET 412l, the STBL signal is pulled low at a rate determined by the drive strength, and a falling edge on the RESETb signal is generated when the STBL signal crosses the $V_{T1}$ threshold. The window on the DCLK signal and the active duration of the WLm signal are sufficiently wide to achieve the desired read timing margin.

For a write operation, the drive strength of inverting driver 250 is weaker than for a read operation because N-FET 412l is turned on for read but not for write. The STBL signal is pulled low at a slower rate, and the falling edge on the RESETb signal occurs later for the write operation. Consequently, the window on the DCLK signal and the active duration of the WLm signal are wider for the write operation. The wider active duration for the WLm signal provides more time to write data to memory cell 152. In the example shown in FIG. 6, node A in memory cell 152 is initially at logic high and is pulled down to logic low via bit line BLx by driver 222a, which fights against inverter 210b. When the voltage at node A reaches a particular trigger threshold, the output of inverter 210a transitions to logic high, which then causes the output of inverter 210b to transition to logic low. Driver 222a and inverter 210b then quickly pull node A to logic low, and node B also quickly transitions from logic low to logic high. The amount of time from the time that node B flips to the falling edge of word line WLm is the write timing margin.

The techniques described herein may be used to combat timing variations due to PVT. The timing variations may be especially severe for new IC processes, which may have large variations in transistor characteristics from chip to chip. The techniques may be used to obtain the desired read and write timing margins across PVT variations and for various memory configurations in order to achieve good performance and high yield. The desired read timing margin may be obtained with the self-timed tracking scheme (which tracks memory cell delay) and the programmable accelerator and/or delay (which provide the desired amount of timing margin). The desired write timing margin may also be obtained with the self-timed tracking scheme and the programmable accelerator and/or delay. Since many memory failures are due to single bit write failure, improving write timing margin may improve yield.

FIG. 7 shows a design of a process 700 for writing data to memory cells in a memory array. At least one control signal used for writing data to the memory cells in the memory array is generated to have timing determined based on dummy cells in the memory array (block 712). The timing of the at least one control signal may be quantified by pulse width on control signals, time difference between transition edges on control signals, etc. Data is written to the memory cells based on the at least one control signal (block 714).

For block 712, an internal clock signal (e.g., RCLK) may be generated based on the dummy cells, e.g., based on loading on a self-timed bit line for a column of dummy cells in the memory array and/or loading on a dummy word line for a row of dummy cells. A pulse may be generated on the internal clock signal for a write operation. The pulse duration may be determined based on the loading on the self-timed bit line and/or the dummy word line.

The self-timed bit line may be driven by a driver having configurable drive strength, which may be provided by a set of selectable transistors in the driver. A subset of the selectable transistors may be selected to drive the self-timed bit line for both read and write operations. A transistor in the driver may be enabled to drive the self-timed bit line for read operations. This transistor may be disabled for write operations to obtain less drive strength for write operations. The less drive strength may result in word lines being activated for longer duration for write operations than for read operations. A reset signal (e.g., RESETb) for the internal clock signal may be generated by detecting a voltage on the self-timed bit line. The reset signal may be generated with a programmable delay to obtain a desired pulse width for the internal clock signal.

Word lines for rows of memory cells in the memory array may be activated based on the internal clock signal. The word lines may be activated for a first duration for read operations and for a second duration for write operations. The first and second durations may be selected to obtain the desired read and write timing margins, respectively. The second duration may be longer than the first duration.

FIG. 8 shows a design of a process 800 for reading data from and writing data to memory cells in a memory array. At least one control signal is generated with first timing for reading data from the memory cells in the memory array, with the first timing for the at least one control signal being determined based on dummy cells in the memory array (block 812). Data is read from the memory cells based on the at least one control signal with the first timing (block 814). The at least one control signal is generated with second timing for writing data to the memory cells, with the second timing for the at least one control signal also being determined based on the dummy cells (block 816). Data is written to the memory cells based on the at least one control signal with the second timing (block 818). The first and second timing may be quantified by different pulse widths on control signals, different time differences between transition edges on control signals, etc.

An internal clock signal may be generated with a first pulse width for read operations in block 812 and with a second pulse width for write operations in block 816. The second pulse width may be longer than the first pulse width. For block 814, word lines for rows of memory cells in the memory array may be activated for a first duration for read operations based on the at least one control signal with the first timing. For block 818, the word lines may be activated for a second duration for write operations based on the at least one control signal with the second timing.

The first and second timing for the at least one control signal may be obtained, e.g., by driving a self-timed bit line for a column of dummy cells in the memory array with first drive strength for read operations and with second drive strength for write operations. The first timing for the at least one control signal may be set (e.g., by selecting a subset of pull-down transistors in driver 250) based on read timing margin for read operations. The first timing may be varied by a predetermined amount (e.g., by disabling a pull-down transistor in driver 250) to obtain the second timing for write operations. The first and second timing for the at least one control signal may also be set independently for read and write operations.

The memory device with delay tracking described herein may be used for wireless communication, computing, networking, personal electronics, etc. The memory device may be implemented as a stand-alone device or may be embedded within a processor, a digital signal processor (DSP), a reduced instruction set computer (RISC), an advanced RISC machine (ARM), a graphics processor, a graphics processing unit (GPU), a controller, a microprocessor, etc. An exemplary use of the memory device for a wireless communication device is described below.

Figure 9:
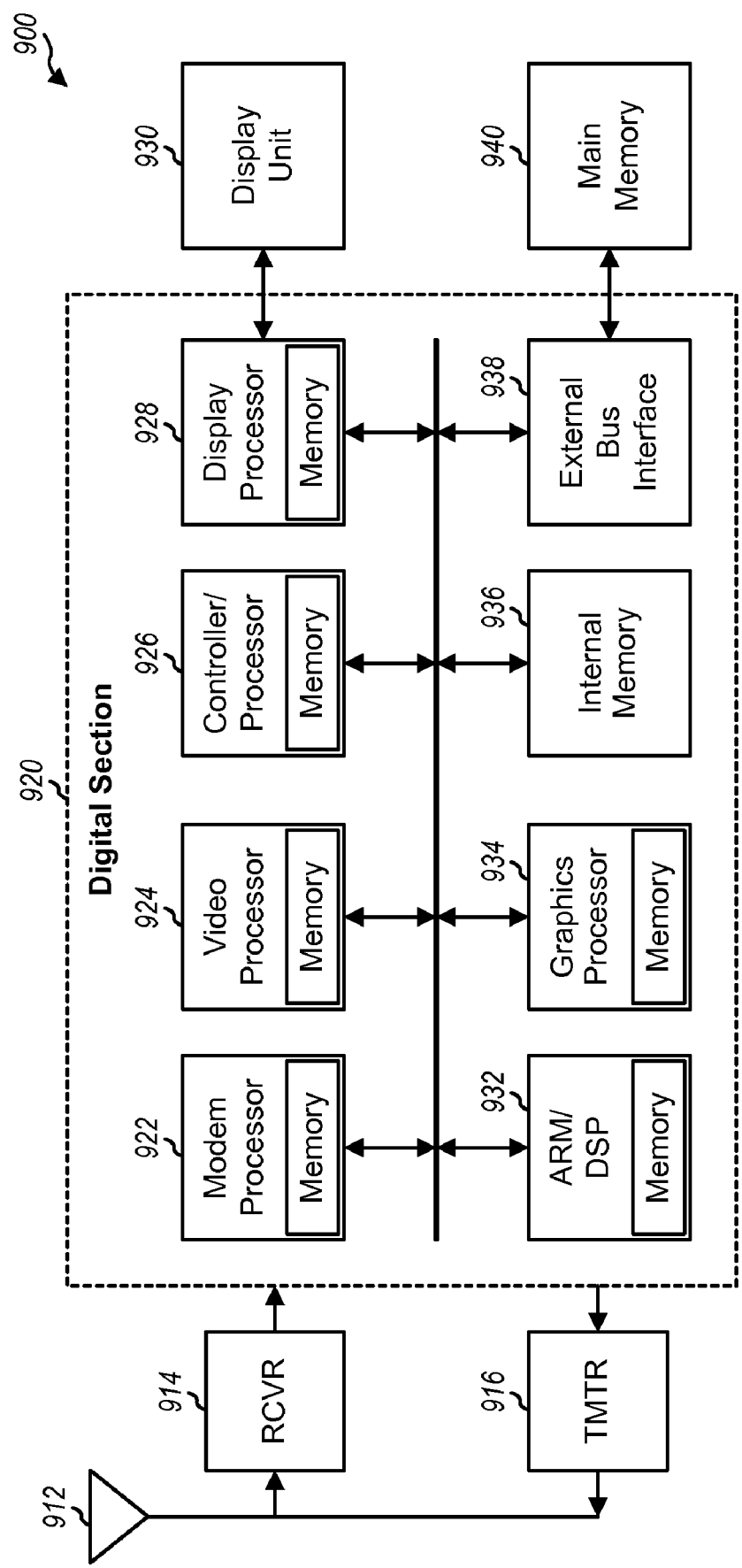
FIG. 9 shows a block diagram of a wireless device.

FIG. 9 shows a block diagram of a wireless device 900 in a wireless communication system. Wireless device 900 may be a cellular phone, a terminal, a handset, a PDA, a wireless modem, etc. The wireless communication system may be a Code Division Multiple Access (CDMA) system, a Global System for Mobile Communications (GSM) system, or some other system.

Wireless device 900 is capable of providing bi-directional communication via a receive path and a transmit path. On the receive path, signals transmitted by base stations are received by an antenna 912 and provided to a receiver (RCVR) 914. Receiver 914 conditions and digitizes the received signal and provides samples to a digital section 920 for further processing. On the transmit path, a transmitter (TMTR) 916 receives data to be transmitted from digital section 920, processes and conditions the data, and generates a modulated signal, which is transmitted via antenna 912 to the base stations.

Digital section 920 includes various processing, interface and memory units such as, for example, a modem processor 922, a video processor 924, a controller/processor 926, a display processor 928, an ARM/DSP 932, a graphics processor 934, an internal memory 936, and an external bus interface (EBI) 938. Modem processor 922 performs processing for data transmission and reception, e.g., encoding, modulation, demodulation, and decoding. Video processor 924 performs processing on video content (e.g., still images, moving videos, and moving texts) for video applications such as camcorder, video playback, and video conferencing. Controller/processor 926 may direct the operation of various units within digital section 920. Display processor 928 performs processing to facilitate the display of videos, graphics, and texts on a display unit 930. ARM/DSP 932 may perform various types of processing for wireless device 900. Graphics processor 934 performs graphics processing, e.g., for graphics, video games, etc. Internal memory 936 stores data and/or instructions for various units within digital section 920. EBI 938 facilitates transfer of data between digital section 920 (e.g., internal memory 936) and a main memory 940.

Each of processors 922 through 934 may include an embedded memory, which may be implemented as described above. Internal memory 936 and main memory 940 may also be implemented as described above. Digital section 920 may be implemented with one or more application specific integrated circuits (ASICs) and/or some other type of ICs.

The memory device described herein may be implemented in various hardware units such as a memory IC, an ASIC, a DSP, a digital signal processing device (DSPD), a programmable logic device (PLD), a field programmable gate array (FPGA), a controller, a processor, and other electronic devices. The memory device may also be fabricated in various IC process technologies such as CMOS, N-MOS, P-MOS, bipolar-CMOS (Bi-CMOS), bipolar, etc. CMOS technology can fabricate both N-FETs and P-FETs on the same IC die, whereas N-MOS technology can only fabricate N-FETs and P-MOS technology can only fabricate P-FETs. The memory device may be fabricated with any device size technology, e.g., 130 nanometer (nm), 65 nm, 30 nm, etc.

An apparatus implementing the memory device described herein may be a stand-alone unit or may be part of a device. The device may be (i) a stand-alone IC, (ii) a set of one or more ICs that may include memory ICs for storing data and/or instructions, (iii) an ASIC such as a mobile station modem (MSM), (iv) a module that may be embedded within other devices, (v) a cellular phone, wireless device, handset, or mobile unit, (vi) etc.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An integrated circuit comprising:
   a memory array comprising memory cells and dummy cells; and
   a timing control circuit configured to generate a control signal for writing data to the memory cells and having timing determined based on the dummy cells, the control signal comprising an internal clock signal generated based on the dummy cells, wherein the timing control circuit comprises:
   a driver to provide a driver output; and
   a programmable detector to receive the driver output and to output a reset for the internal clock signal, wherein the reset is generated at a time based on a first delay dependent on a configured drive strength of the driver and a second selectable delay having a programmable duration that is independent of the configured drive strength of the driver.

2. The integrated circuit of claim 1, wherein the internal clock signal is generated based on loading on a bit line for a column of dummy cells in the memory array.

3. The integrated circuit of claim 1, wherein the internal clock signal is generated based on loading on a word line for a row of dummy cells in the memory array and further based on a selected delay duration of the second selectable delay of the programmable detector.

4. The integrated circuit of claim 2, wherein the internal clock signal has a duration determined based on the loading on the bit line for the column of dummy cells.

5. The integrated circuit of claim 1, wherein the driver is operative to drive a bit line for a column of dummy cells in the memory array.

6. The integrated circuit of claim 1, wherein the driver comprises a plurality of transistors selectable to provide the configured drive strength.

7. The integrated circuit of claim 1, wherein the second selectable delay is selected to obtain a particular timing margin.

8. The integrated circuit of claim 6, wherein the plurality of transistors comprises a transistor that is turned on during read operations and turned off during write operations to obtain less drive strength for the driver during write operations than during read operations, the less drive strength resulting in word lines being activated for longer duration during write operations than during read operations.

9. The integrated circuit of claim 1, further comprising an address decoder configured to activate a plurality of word lines for a plurality of rows of memory cells in the memory array based on the internal clock signal.

10. The integrated circuit of claim 9, wherein the plurality of word lines are activated for a first duration during read operations and for a second duration during write operations.

11. The integrated circuit of claim 10, wherein the second duration is longer than the first duration.

12. The integrated circuit of claim 1, wherein the second selectable delay is provided via a set of inverters within the programmable detector.

13. The integrated circuit of claim 1, wherein the programmable duration is based on a number of inverters within the programmable detector, wherein the number of inverters is independent of the configured drive strength of the driver.

14. The integrated circuit of claim 1, wherein the programmable duration is one of a first delay provided by a first set of inverters, a second delay that is greater than the first delay and that is provided by a second set of inverters, and a third delay that is greater than the second delay and that is provided by a third set of inverters.

15. A method comprising:
   generating a control signal at a timing control circuit comprising a programmable detector that receives a self timed bit line signal based upon a configured drive strength of a driver, the control signal used for writing data to memory cells in a memory array, the control signal having timing determined based on dummy cells in the memory array, wherein the control signal comprises a reset generated at a time based on a first delay dependent on the configured drive strength of the driver and a second selectable delay having a programmable duration that is independent of the configured drive strength of the driver; and
   writing data to the memory cells based on the at least one control signal.

16. The method of claim 15, wherein the internal clock signal is generated based on loading on a bit line for a column of dummy cells in the memory array.

17. The method of claim 15, wherein generating the control signal further comprises:

driving a bit line for a column of dummy cells in the memory array with the configured drive strength; and generating the internal clock signal based at least in part on a signal on the bit line.

18. The method of claim 17, wherein driving the bit line for the column of dummy cells with the configured drive strength comprises driving the bit line with a transistor during read operations and disabling the transistor during write operations to obtain less drive strength during the write operations than during the read operations, resulting in word lines being activated for longer duration during the write operations than during the read operations.

19. The method of claim 15, wherein the second selectable delay is determined by selecting one of a plurality of distinct sets of inverters at the programmable detector.

20. An apparatus comprising:

means for generating a control signal for writing data to memory cells in a memory array, the control signal having timing determined based on dummy cells in the memory array, the control signal comprising an internal clock signal;

programmable detector means for outputting a reset for the internal clock signal, wherein the reset is generated at a time based on a first delay dependent on a configured drive strength of a driver and a second selectable delay having a programmable duration that is independent of the configured drive strength of the driver; and means for writing data to the memory cells based on the control signal.

21. The apparatus of claim 20, wherein the means for generating the control signal further comprises means for driving a bit line for a column of dummy cells in the memory array with the configured drive strength of the driver.

22. The apparatus of claim 21, wherein the means for driving the bit line for the column of dummy cells with the configured drive strength of the driver comprises:

means for driving the bit line with a transistor for read operations; and means for disabling the transistor during write operations to obtain less drive strength for write operations than during the read operations, the less drive strength resulting in word lines being activated for longer duration during the write operations than during the read operations.

23. The apparatus of claim 20, wherein the programmable duration is determined by selecting one of a plurality of sets of inverters at the programmable detector, wherein each set of inverters has a distinct number of inverters.

24. An integrated circuit comprising:

a memory array comprising memory cells and dummy cells; and a timing control circuit configured to generate a control signal for reading data from the memory cells and for writing data to the memory cells, the control signal comprising an internal clock signal having timing determined based on the dummy cells, the timing control circuit comprising:

a driver to provide a driver output; and a programmable detector to receive the driver output and to output a reset for the internal clock signal, wherein the reset is generated at a time based on a first delay dependent on a configured drive strength of the driver and a second selectable delay having a programmable duration that is independent of the configured drive strength of the driver.

25. The integrated circuit of claim 24, wherein the internal clock signal has a first pulse width for read operations and a second pulse width for write operations.

26. The integrated circuit of claim 25, wherein the second pulse width is longer than the first pulse width.

27. The integrated circuit of claim 24, wherein the driver is configured to drive a bit line for a column of dummy cells in the memory array, the driver having a first drive strength during read operations and a second drive strength during write operations.

28. The integrated circuit of claim 24, further comprising an address decoder configured to activate a plurality of word lines for a plurality of rows of memory cells in the memory array, the plurality of word lines being activated for a first duration during read operations and for a second duration during write operations.

29. The integrated circuit of claim 24, wherein the timing of the control signal is set independently for a read operation and for a write operation.

30. The integrated circuit of claim 24, wherein the timing of the control signal is set based on a read timing margin for read operations and the timing of the control signal is varied by a predetermined amount for write operations.

31. The integrated circuit of claim 24, wherein the programmable duration is determined by selecting one of a plurality of sets of inverters at the programmable detector, wherein each set of inverters has a distinct number of inverters.

* * * * *